(12) United States Patent
Negoi

(10) Patent No.: US 8,154,834 B2
(45) Date of Patent: Apr. 10, 2012

(54) PROTECTION CIRCUIT WITH OVERDRIVE TECHNIQUE

(75) Inventor: Andy C. Negoi, Crolles (FR)

(73) Assignee: NXP B.V., Eindhoven (NL)

( * ) Notice: Subject to any disclaimer, the term of this patent is extended or adjusted under 35 U.S.C. 154(b) by 90 days.

(21) Appl. No.: 12/514,929

(22) PCT Filed: Nov. 14, 2007

(86) PCT No.: PCT/IB2007/054634
§ 371 (c)(1),
(2), (4) Date: May 14, 2009

(87) PCT Pub. No.: WO2008/059451
PCT Pub. Date: May 22, 2008

(65) Prior Publication Data
US 2010/0027175 A1    Feb. 4, 2010

(51) Int. Cl.
*H02H 3/22* (2006.01)
(52) U.S. Cl. .................................... 361/56; 361/111
(58) Field of Classification Search .................. 361/56, 361/111
See application file for complete search history.

(56) References Cited

U.S. PATENT DOCUMENTS

| | | | |
|---|---|---|---|
| 5,946,177 A | 8/1999 | Miller et al. | |
| 6,091,593 A | 7/2000 | Lin | |
| 6,147,538 A * | 11/2000 | Andresen et al. | 327/309 |
| 6,233,130 B1 | 5/2001 | Lin | |
| 6,522,511 B1 | 2/2003 | Willis et al. | |
| 7,372,679 B1 * | 5/2008 | Ho et al. | 361/56 |
| 2003/0214768 A1 | 11/2003 | Lin et al. | |
| 2004/0109270 A1 | 6/2004 | Stockinger et al. | |
| 2005/0078419 A1 | 4/2005 | Stockinger et al. | |
| 2006/0181823 A1 * | 8/2006 | Miller et al. | 361/56 |

OTHER PUBLICATIONS

Stockinger, M., et al; "Advanced Rail Clamp Networks for ESD Protection"; Microelectronics and Reliability, Elseiver Science LTD, GB; vol. 45, No. 2; Feb. 2, 2005; p. 211-222; XP004708560; ISSN: 0026-2714.

* cited by examiner

*Primary Examiner* — Danny Nguyen

(57) ABSTRACT

The present invention relates to a protection circuit and method of protecting a semiconductor circuit against a temporary excessive voltage on a supply line, wherein a first trigger signal is generated in response to a detection of an excessive voltage on the supply line and a clamp element (M1) is activated by applying a boosted second trigger signal at a voltage higher than the first trigger signal to a control terminal of the clamp element (M1) in response to said first trigger signal, to thereby generate a low resistive path between said supply line and a lower reference potential. Thereby, the clamp element (M1) is activated with a higher voltage and can thus be made smaller in width. Because the clamp element is smaller, a remote trigger circuit can be sized tighter and faster.

6 Claims, 3 Drawing Sheets

US 8,154,834 B2

PROTECTION CIRCUIT WITH OVERDRIVE TECHNIQUE

FIELD OF THE INVENTION

The present invention relates to a protection circuit and method for protecting a semiconductor circuit against a temporary excessive voltage on a supply line The excessive voltage may be caused as a result of an electrostatic discharge (ESD) or other external noise or interference.

BACKGROUND OF THE INVENTION

In advanced complementary metal oxide semiconductor (CMOS) technologies gate oxides are very thin and operating on supply voltages (Vdd) are confined in small ranges, such as 1V for example. MOS transistor structures in the integrated circuit (IC) core are thus very fragile and high voltages can be generated by electrostatic charging in the manufacturing chain, at the chip assembly or in applications, which might destroy the IC.

Between the IC core and the outside world, input/output (IO) cells may be organized in a ring, which are responsible for Vdd level shifting, for noise immunity, and—at the same time—for protection of the IC core from ESD shocks or other temporary excessive voltages that can occur at the pins. In order to fulfill this protection function, each I/O cell may comprise a big transistor, generally of the N-channel MOS (NMOS) type, which represents an alternative, low resistive path when it is activated, thereby short-circuiting the supply line Vdd to ground potential (Gnd) or another lower reference potential. Thereby, it can be ensured that ESD charge or other excessive charge does not pass through or influence the active circuitry.

However, creating a very conductive current path in case of an ESD event or other excessive temporary voltages to allow high current flow (e.g. about 4 A) requires very high current capability design for the I/O protection network. To this end, the use of MOS clamps has the advantage that, with good models, the ESD behavior can be easily simulated and the design of the I/O ring can be optimized for the smallest size. Metal rail resistances and high current path design have a crucial importance in technologies with gate lengths below 100 nm (e.g. CMOS090, CMOS065, CMOS045 and below). In order to improve the speed of reaction of trigger circuits which produce a pulse to be applied to the gate of e.g. NMOS ESD clamps in each I/O in case of the detection of a very fast rising edge on a special rail (which may be called "ESD_boost"), a distributed and boosted ESD network has been developed.

FIG. 3 shows a schematic circuit diagram of a exemplary distributed boosted ESD network as disclosed for example in Michael Stockinger, James W. Miller et al, "Boosted and Distributed Rail Clamp Networks for ESD protection in Advanced CMOS Technologies", Proc. Of EOS/ESD Symposium 2003. In FIG. 3, two adjacent I/O cells 10-1 and 10-2 are shown. The PMOS and NMOS transistors are used as output buffer transistors. The LNPN and LPNP bipolar transistors are lateral bipolar transistors inherent to the MOS structures. In case the I/O cells 10-1 and 10-2 were not protected or the protection is failing to trigger, then the output buffer transistors would be destroyed because of the high current passing through the associated LNPN or LPNP. The drains of the output buffer transistors are directly tied to respective I/O pads 14-1 and 14-2.

The ESD protection network consists of two low resistive metal lines or rails vdde and gnde, carrying all ESD transient current, one boost line or rail esd_boost connected through a diode A2 to the respective I/O pads 14-1 and 14-2 (i.e., a rail which does not carry a lot of current and serves to supply a remote trigger circuit 20), diodes A1 and B which carry all ESD current and closing the loop, and respective ESD clamps 12-1 and 12-1, which are large NMOS devices driven by the remote trigger circuit 20. The trigger circuit 20 can be implemented in several ways, for example a so-called slew-rate detector with monostable trigger pulse generator. When a very fast rising pulse (for example 4V in less than 10 ns) occurs on the boost rail esd_boost, a pulse is immediately fired by the trigger circuit 20 for a predetermined time period (e.g. about 1 µs) within which it is considered that the ESD event is finished and all electrostatic charge has been evacuated. If the rise time of the boost rail esd_boost is longer (for example in a normal power-up event), then there is no pulse generated by the trigger circuit 20. The energy for triggering the ESD clamps 12-1 and 12-2 via a special trigger line or rail esd_trigger is taken from the ESD energy. Thus, the trigger circuit 20 operates even if power supply of the integrated circuit is active or switched on.

Furthermore, in FIG. 3, the clamps 12-1 and 12-2 are distributed and each one takes more or less current depending on their gate-source drive voltages $V_{GS}$ which vary because of the voltage drop along the ground rail gnde. Therefore, several trigger circuits 20 have to be provided, on one side because of the voltage drop along the ground rail gnde, and on the other side because the clamps 12-1 and 12-2 themselves are large transistors and there is a need to provide a certain driving strength of the trigger circuits 20.

However, a disadvantageous side effect of the large clamps 12-1 and 12-2 is that current leakage during normal operation increases with the width of the clamp. Typical leakage values are in the order of a few picoamperes per micron width at room temperature and are increasing with the temperature. If the clamp is very wide and/or operation temperature is high, the leakage current can be in the order of tens of microamperes, and in ICs with a large number of connection pins (for example 1000 pins) total leakage can be in the order of milliamperes just for these clamps in normal operation. Moreover, a large clamp occupies large area in each I/O cell in prejudice of the active circuitry and requires a large trigger circuit buffer to drive the gates of several clamps fast and efficiently enough.

SUMMARY OF THE INVENTION

An object of the present invention is to provide an improved method and protection circuit, by means of which the size of the protection clamps can be reduced. This object may be achieved as described in the following example embodiments.

In an example embodiment, there is protection circuit for protecting a semiconductor circuit against a temporary excessive voltage on a supply line. The protection circuit comprises a clamp element for generating a low resistive path between said supply line and a lower reference potential, when activated. A trigger circuit generates a first trigger signal in response to the detection of an excessive voltage on said supply line. An overdrive circuit activates the clamp element by applying a boosted second trigger signal at a voltage higher than said first trigger signal to a control terminal of the clamp element in response to said first trigger signal, the protection circuit being arranged between a trigger rail for conducting the first trigger signal and the control terminal of the clamp element.

In another example embodiment, there is a method of protecting a semiconductor circuit against a temporary excessive voltage on a supply line. The method comprises generating a first trigger signal in response to a detection of an excessive voltage on said supply line and activating a clamp element by applying a boosted second trigger signal at a voltage higher than said first trigger signal to a control terminal of said clamp element in response to said first trigger signal, to thereby generate a low resistive path between said supply line and a lower reference potential.

Accordingly, the clamp element can be driven with a voltage higher than the normal trigger pulse amplitude and can thus be reduced in width. This reduced width results in a lower current leakage. Moreover, because the clamp element can be made smaller, the trigger circuit can be sized tighter (i.e., smaller transistors) and faster.

This solution applies to all integrated circuits and allows to achieve better voltage protection using smaller protection elements, being thus more area (and thus cost) efficient than the state of the art solutions. As the clamp element is overdriven with a voltage which is higher than the normal trigger signal amplitude, it can conduct the current caused by the excessive voltage more efficiently, having more margin to reduce the size of the clamp element. Increasing the drive voltage will allow to decrease the width of the device conserving the same current drive capability.

The protection circuit so arranged between a trigger rail for conducting the first trigger signal and the control terminal of the clamp element requires no modification of the I/O cell architecture.

Furthermore, the semiconductor circuit may comprise a core circuit and a plurality of I/O cells arranged in a ring structure around the core circuit, wherein the protection circuit is provided in at least one of said I/O cells. This structure improves noise immunity and protection of the core against shocks caused by excessive voltages.

Additionally, the overdrive circuit may comprise an energy storing element selectively chargeable to a boosted voltage derived from said temporary excessive voltage, and a pulse forming circuit for initiating charging of the energy storing element prior to generation of the first trigger signal. The proposed protection circuit thus relies on the energy of the excessive voltage (e.g., ESD energy), which means that power supply is only needed during the excessive voltage event, while no clock signal or the like is required to rise the control voltage of the clamp element. In an example, the pulse forming circuit may comprise a timing circuit with a predetermined time constant. The energy storing element may comprise a capacitor.

Further advantageous embodiments are defined in the dependent claims.

BRIEF DESCRIPTION OF THE DRAWINGS

In the following, the present invention will be described in greater detail based on an embodiment with reference to the accompanying drawings in which.

DESCRIPTION OF THE EMBODIMENT

The embodiments of the present invention will now be described in greater detail based on a ESD protection circuit for rail-based distributed ESD networks.

Figure 1:
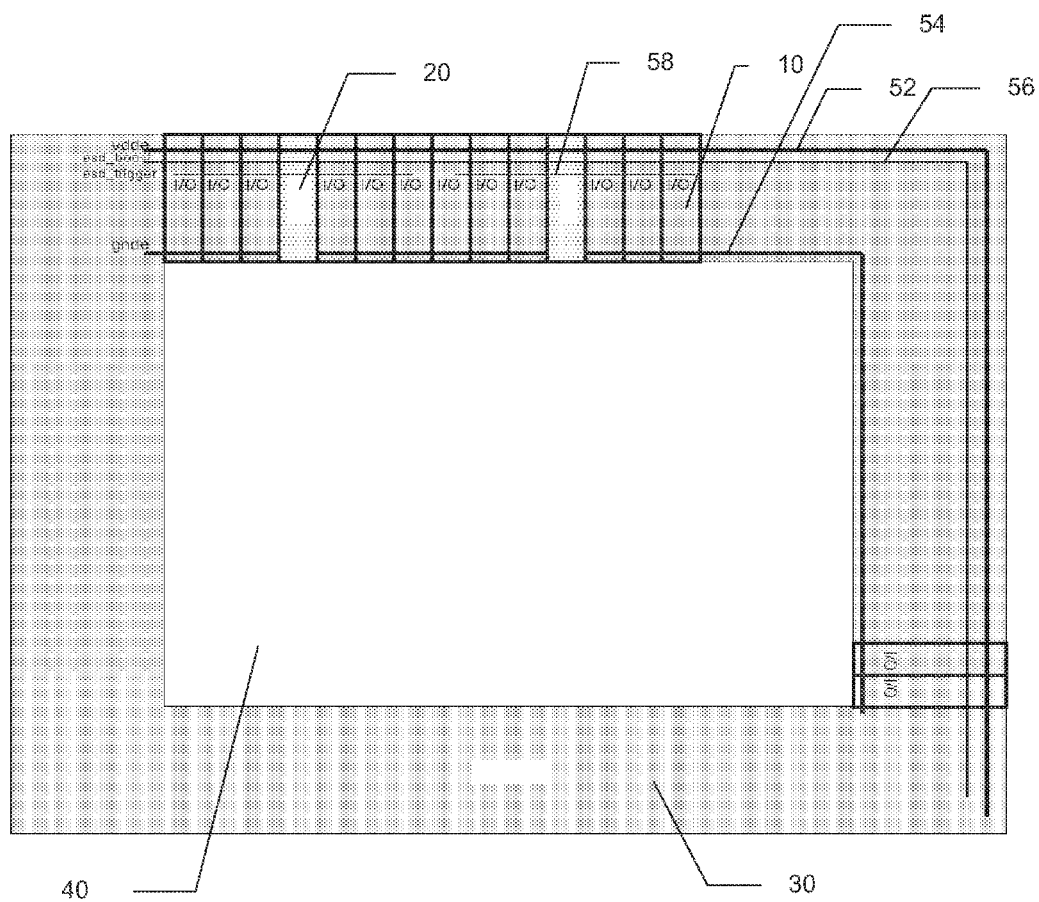
FIG. 1 shows an example of an integrated circuit with I/O ring and protection rails according to the embodiment.

FIG. 1 shows an example of an integrated circuit according to the embodiment with I/O ring 30 and protection rails esd_boost 56 and esd_trigger 58 as described initially. Between the IC core 40 and the outside world, I/O cells 10 are organized in a ring to form the I/O ring 30. The I/O cells 10 are responsible for supply voltage level shifting for noise immunity and at the same time for excessive-voltage protection of the IC core 40, and receive their supply voltage from a supply rail vdde 52 and a ground rail gnde 54. Distributed trigger circuits 20 for triggering ESD clamps of the I/O cells 10 are placed between some of the I/O cells 10.

It is known that for an MOS transistor the drain current is proportional to $W/L \, (V_{GS}-V_T)^2$, wherein W and L denote the gate width and length, respectively, $V_T$ denotes the threshold voltage (typically 0.6V) and $V_{GS}$ denotes the gate-source voltage. The clamp gates are driven via the trigger rail esd_trigger 58 by a pulse of an amplitude of about 4V (in the example of a supply voltage Vdd=2.5V) occurring suddenly on the boost rail esd_boost 56 from an ESD shock. The pulse duration is about one microsecond. In order to pass a high current through the individual clamp two solutions can be identified, $V_T$ is a technology parameter and L being always used at minimum value.

The amplitude of the trigger circuit pulse is given by the voltage developed in the ESD event over the boost rail esd_boost 56. The ESD event occurs suddenly and while the integrated circuit is not supplied (Vdd=0). There is no energy storage allowing to drive the clamps with more than the voltage drop between the boost rail esd_boost 56 and the ground rail gnde 54 of the ESD discharge. A voltage multiplier circuit of charge pump type (as for example known from non-volatile memories EEPROM) is too slow, needs much area and needs a clock and a supply voltage in order to operate, which at time scales of one nanosecond is not practical at all. Moreover, such a voltage rising circuit would have to be placed near each ESD clamp.

In the embodiment, a protection circuit is provided, which generates a higher control voltage at the clamp gate, thereby allowing to decrease the clamp width for the same drain current capability. Thus, the gates of the ESD clamps are driven with a voltage higher than the pulse amplitude at the trigger rail esd_trigger 58. The proposed circuit is small enough to be integrated in each I/O cell. The ESD clamp can thus be reduced e.g. by more than a half in width, wherein the freed silicon area can be used for this protection circuit. Because the ESD clamp can be kept smaller, the remote trigger circuit can be sized tighter (smaller transistors) and faster. The protection circuitry can be inserted between the trigger rail esd_trigger 58 and the gate of the ESD clamp and does not require any modification of the I/O cell architecture (except the ESD clamp size). Because the ESD clamp is narrower, the leakage is reduced.

Additionally, the proposed protection circuit according to the embodiment is operated by the ESD energy and supplied by the boost rail esd_boost 56. This means, the protection circuit is supplied only in case of an ESD event and does not need any clock signal to rise the gate voltage of the clamp.

Figure 2:
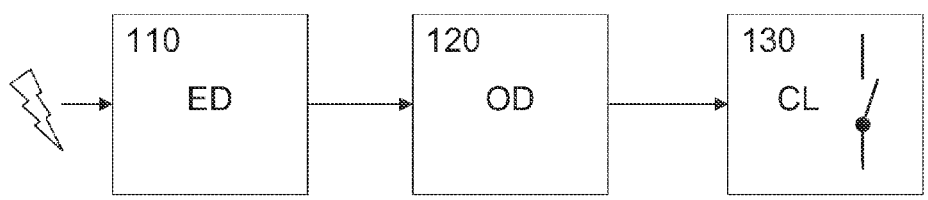
FIG. 2 shows a schematic block diagram of a protection scheme according to the embodiment.

FIG. 2 shows a schematic block diagram of a protection scheme according to the embodiment. When an excessive voltage, such as an ESD discharge, is detected in a detection step or functionality 110, an overdrive step or functionality 120 is activated to generate an overdrive voltage which is higher than the trigger pulse amplitude generated by the trigger circuit. This overdrive voltage is used in a driving step or functionality 130 for driving a clamp element which can thus be reduced in width.

Figure 3:
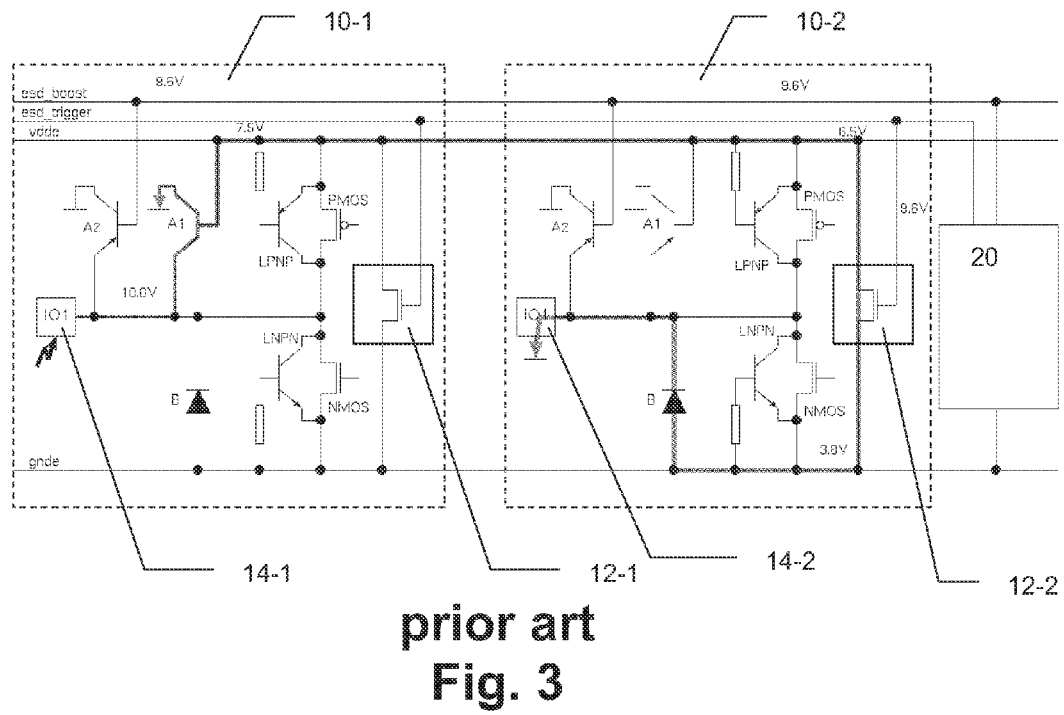
FIG. 3 shows a schematic circuit diagram of a distributed boosted protection network according to the prior art.
Figure 4:
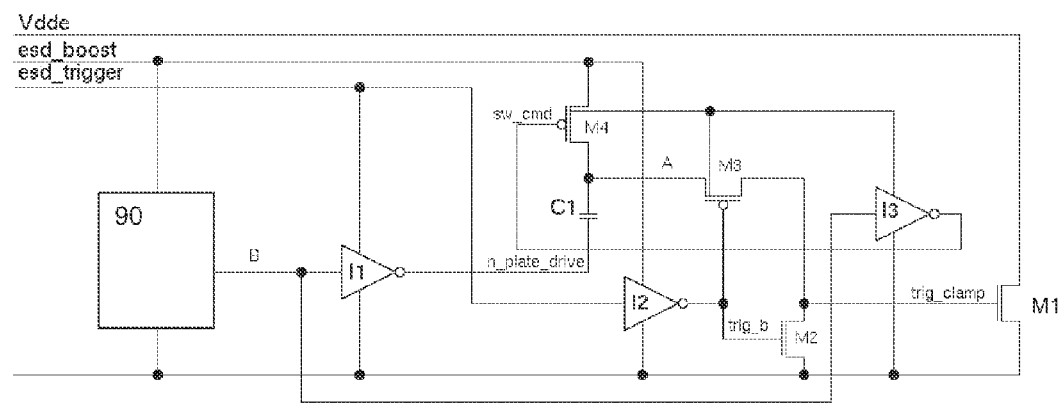
FIG. 4 shows a schematic circuit diagram of a protection circuit with overdrive circuit according to the embodiment.

FIG. 4 shows a schematic circuit diagram of a protection circuit with overdrive circuit according to the embodiment. This circuit of FIG. 4 may replace the boxes 12-1 and 12-2 in FIG. 3. We distinguish three classic CMOS inverters I1, I2, I3, one capacitor C1 which stores the energy to overdrive the gate of a clamping transistor M1 (clamp element), one NMOS transistor switching element M2 which has the role to keep the gate of the clamping transistor M1 on ground potential when the trigger pulse on the trigger rail esd_trigger is finished or is at ground potential in normal operation, and two PMOS transistor switching elements M3 and M4 in a separate NWELL which will actually elevate the gate potential of the clamping transistor M1 in case of an ESD event. A slew-rate detector 90 is locally provided in each I/O cell and used to initiate charging of the capacitor C1 in the rising phase of the voltage on the boost rail esd_boost, so as to store a part of the ESD event energy for the gate overdrive.

In particular, the slew-rate detector 90 generates a pulse at a node B in the order of e.g. 1 to 5 ns, a duration which is substantially shorter than the duration of the trigger pulse (~1 us). This pulse is supplied to first and second buffer inverters I1 and I3. The second buffer inverter I3 generates a control signal sw_cmd to control the switching element M4 that charges a capacitor C1 at node A. Directly after this pulse the first buffer inverter I1 charges the capacitor C1 at its opposite node by a voltage n_plate_drive. Now, a boosted voltage is available at node A. This voltage is offered via the switching element M3 as a control signal trig_clamp to the clamp transistor M1. After the end of the trigger pulse the inverter I2 controls the switching element M2 by a control signal trig_b to close and the switching element M3 to open, so that the voltage of the control signal trig_clamp is pulled down to ground potential, and the clamp transistor M1 is no longer conductive.

Figure 5:
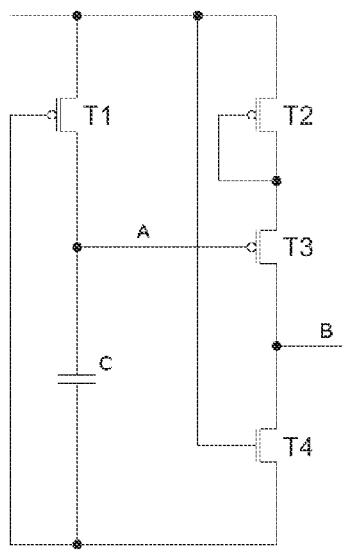
FIG. 5 shows a schematic circuit diagram of a slew-rate detector topology which may be used in the embodiment.

FIG. 5 shows an exemplary schematic circuit diagram of the slew-rate detector 90. A first transistor T1 and a capacitor C form an RC group with a time constant of e.g. 500 picoseconds. The capacitor C is keeping a node A at ground in the initial phase. Third and fourth transistors T3 and T4 form a pulse amplifier, and at the node B a pulse of about 2 ns duration is generated, which allows the capacitor C1 of the FIG. 4 to be charged with the voltage at the boost rail esd_boost, while the trigger rail esd_trigger is still at a low level (before triggering).

When the pulse at the node B extinguishes, the switching element M4 of FIG. 4 opens (the signal sw_cmd is generated by the buffer inverter I3 at a potential of the node A) and the switching element M3 is conducting, driven by the trigger pulse at the trigger rail esd_trigger through the inverter I2. The bottom plate of the capacitor C1 is also driven up by the trigger rail esd_trigger (through the buffer inverter I1 whose input is at ground potential) and thus the potential at the node A rises to (theoretically) two times the amplitude at the trigger rail esd_trigger. Because the capacitor C1 can not be too large (for place and speed considerations) and because of the charge sharing with the gate-source capacity $C_{GS}$ of the clamping transistor M1, the potential at the node A will be about 1.5 times the amplitude at the trigger rail esd_trigger.

Figure 6:
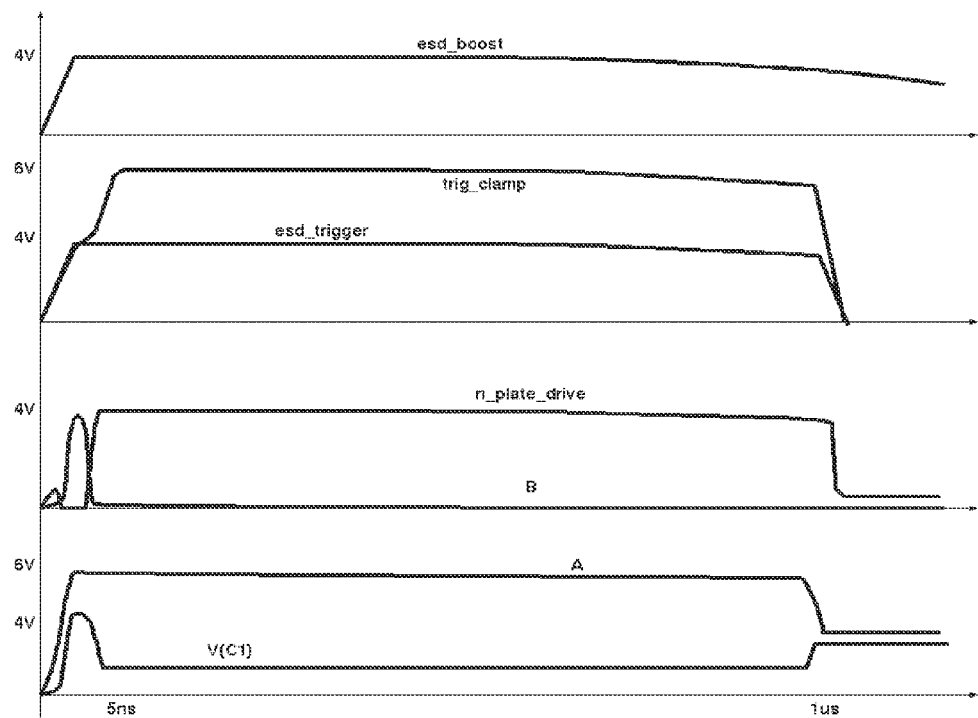
FIG. 6 shows waveforms obtained at different nodes of the protection circuit of FIG. 4.

FIG. 6 shows waveforms indicating the functionality of the protection circuit of FIG. 4. One effect of the proposed protection circuit according to the embodiment is that now the ESD clamp width can be dimensioned much smaller, representing a lighter load for the trigger circuit and presenting a smaller static leakage. For example, in an application, the clamp size may be without overdrive distributed in 26 fingers each of W=11.7 μm and L=0.28 μm, driven with trigger pulse of 4V.

As can be gathered from FIG. 6, an ESD event or other transient excessive voltage leads to a fast increase of the voltage on the boost rail esd_boost (cf. upper waveform). The capacitor C1 is then charged to an increased voltage of about 6.1V, as indicated by the second waveform of the signal trig_clamp. By driving the clamp with an overdrive voltage of 6.1V as shown in FIG. 6, the same drain current can be achieved with a clamp of only 10 fingers of W=11.7 μm and L=0.28 μm, the saved area being fully occupied by the additional circuitry of FIG. 4. As regards reliability, a gate-source voltage of the clamp of 6V causes no problem because the duration of ESD conditions or temporary excessive voltages is typically only less than a second over the whole lifetime of the product.

Additionally, in the third diagram of FIG. 6, the waveform at node B and the waveform of the voltage n_plate_drive indicate that the peak voltage at the node B occurs when the voltage on the boost rail esd_boost rises and the voltage on the trigger rail esd_rigger have not yet reached their maximum values. Thereby, charging of the capacitor C1 starts earlier than the trigger pulse, so that a boosted drive voltage trig_clamp can be applied to the clamping transistor M1.

In summary, a protection circuit and method of protecting a semiconductor circuit against a temporary excessive voltage on a supply line have been described, wherein a first trigger signal is generated in response to a detection of an excessive voltage on the supply line and a clamp element is activated by applying a boosted second trigger signal at a voltage higher than the first trigger signal to a control terminal of the clamp element in response to said first trigger signal, to thereby generate a low resistive path between said supply line and a lower reference potential. Thereby, the clamp element is activated with a higher voltage and can thus be made smaller in width. Because the clamp element is smaller, a remote trigger circuit can be sized tighter and faster.

In general, the present invention is not restricted to the above embodiment and can be implemented in any integrated circuit I/O cell architecture. The added protection circuit can be arranged close to the protection clamps and can be provide in selected ones or each I/O cell. It applies for all general purpose and special I/O types for commercial products (like integrated circuits used in consumer electronics, computers, mobile phones, set-top-boxes, etc.). For mobile applications, the use of the protection circuit will lead to reduced static leakage (and thus lower current consumption and longer battery life). Another effect of using smaller ESD protection elements is the relaxation of the rules for placing trigger circuits (the distance between two trigger circuits could be made larger in the I/O ring) or the existing trigger circuits could be sized smaller, saving area in the integrated circuit periphery. In terms of ESD protection, smaller clamps mean less RC parasitic elements and a faster operation for very fast pulses, which is a clear benefit for the ESD robustness. The above embodiments may thus vary within the scope of the attached claims.

The invention claimed is:

1. A protection circuit for protecting a semiconductor circuit against a temporary excessive voltage on a supply line, said protection circuit comprising:

a clamp element for generating a low resistive path between said supply line and a lower reference potential, when activated;

a trigger circuit for generating a first trigger signal in response to the detection of an excessive voltage on said supply line; and an overdrive circuit for activating said clamp element by applying a boosted second trigger signal at a voltage higher than said first trigger signal to a control terminal of said clamp element in response to said first trigger signal, the protection circuit being arranged between a trigger rail for conducting said first trigger signal and said control terminal of said clamp element.

2. A protection circuit for protecting a semiconductor circuit against a temporary excessive voltage on a supply line, said protection circuit comprising:

a clamp element for generating a low resistive path between said supply line and a lower reference potential, when activated;

a trigger circuit for generating a first trigger signal in response to the detection of an excessive voltage on said supply line; and an overdrive circuit for activating said clamp element by applying a boosted second trigger signal at a voltage higher than said first trigger signal to a control terminal of said clamp element in response to said first trigger signal, the semiconductor circuit including a core circuit and a plurality of input/output (I/O) cells arranged in a ring structure around said core circuit, and wherein said protection circuit is provided in at least one of said I/O cells.

3. A protection circuit for protecting a semiconductor circuit against a temporary excessive voltage on a supply line, said protection circuit comprising:

a clamp element for generating a low resistive path between said supply line and a lower reference potential, when activated;

a trigger circuit for generating a first trigger signal in response to the detection of an excessive voltage on said supply line; and an overdrive circuit for activating said clamp element by applying a boosted second trigger signal at a voltage higher than said first trigger signal to a control terminal of said clamp element in response to said first trigger signal, the overdrive circuit including an energy storing element selectively chargeable to a boosted voltage derived from said temporary excessive voltage, and a pulse forming circuit for initiating charging of said energy storing element prior to generation of said first trigger signal.

4. The protection circuit according to claim 3, wherein said pulse forming circuit comprises a timing circuit with a predetermined time constant.

5. The protection circuit according to claim 3, wherein said energy storing element comprises a capacitor.

6. A method of protecting a semiconductor circuit against a temporary excessive voltage on a supply line, said method comprising:

generating a first trigger signal in response to a detection of an excessive voltage on said supply line; and activating a clamp element by applying a boosted second trigger signal at a voltage higher than said first trigger signal to a control terminal of said clamp element in response to said first trigger signal, to thereby generate a low resistive path between said supply line and a lower reference potential.

\* \* \* \* \*